(12) United States Patent
Sharma et al.

(10) Patent No.: US 11,777,013 B2
(45) Date of Patent: Oct. 3, 2023

(54) CHANNEL FORMATION FOR THREE DIMENSIONAL TRANSISTORS

(71) Applicant: Intel Corporation, Santa Clara, CA (US)

(72) Inventors: Abhishek Sharma, Hillsboro, OR (US); Willy Rachmady, Beaverton, OR (US); Van H. Le, Portland, OR (US); Jack T. Kavalieros, Portland, OR (US); Gilbert Dewey, Beaverton, OR (US); Matthew Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 947 days.

(21) Appl. No.: 16/457,626

(22) Filed: Jun. 28, 2019

(65) Prior Publication Data

US 2020/0411669 A1 Dec. 31, 2020

(51) Int. Cl.

| | |
|---|---|
| *H01L 29/66* | (2006.01) |
| *H01L 29/78* | (2006.01) |
| *H01L 29/06* | (2006.01) |
| *H01L 29/423* | (2006.01) |
| *H01L 29/49* | (2006.01) |
| *H01L 21/02* | (2006.01) |
| *H01L 29/45* | (2006.01) |
| *H01L 29/786* | (2006.01) |
| *H01L 29/417* | (2006.01) |

(52) U.S. Cl.
CPC .... *H01L 29/66742* (2013.01); *H01L 21/0262* (2013.01); *H01L 21/02603* (2013.01); *H01L 29/0673* (2013.01); *H01L 29/41733* (2013.01); *H01L 29/42392* (2013.01); *H01L 29/45* (2013.01); *H01L 29/4908* (2013.01); *H01L 29/78618* (2013.01); *H01L 29/78696* (2013.01)

(58) Field of Classification Search
CPC ..... H01L 29/06; H01L 29/0673; H01L 29/41; H01L 29/41733; H01L 29/41775; H01L 29/42; H01L 29/42392; H01L 29/49; H01L 29/4908; H01L 29/66; H01L 29/66969
USPC ........................................................ 257/347
See application file for complete search history.

(56) References Cited

U.S. PATENT DOCUMENTS 11,171,211 B1 * 11/2021 Park .................. H01L 29/78681
2013/0341704 A1 * 12/2013 Rachmady ............. H01L 29/78 977/890

(Continued)

*Primary Examiner* — Fazli Erdem

(74) *Attorney, Agent, or Firm* — Schwabe, Williamson & Wyatt P.C.

(57) ABSTRACT

Embodiments herein describe techniques for a three dimensional transistor above a substrate. A three dimensional transistor includes a channel structure, where the channel structure includes a channel material and has a source area, a drain area, and a channel area between the source area and the drain area. A source electrode is coupled to the source area, a drain electrode is coupled to the drain area, and a gate electrode is around the channel area. An electrode selected from the source electrode, the drain electrode, or the gate electrode is in contact with the channel material on a sidewall of an opening in an inter-level dielectric layer or a surface of the electrode. The electrode is further in contact with the channel structure including the source area, the drain area, or the channel area. Other embodiments may be described and/or claimed.

20 Claims, 13 Drawing Sheets

(56) References Cited

U.S. PATENT DOCUMENTS

2016/0056301 A1* 2/2016 Lee .................. H01L 29/42352
   257/295
2017/0069734 A1* 3/2017 Doris ............... H01L 29/78684
2019/0123138 A1* 4/2019 Leobandung ........ H01L 29/413
2020/0312971 A1* 10/2020 Penumatcha ..... H01L 29/42368

* cited by examiner

US 11,777,013 B2

CHANNEL FORMATION FOR THREE DIMENSIONAL TRANSISTORS

FIELD

Embodiments of the present disclosure generally relate to the field of integrated circuits, and more particularly, to transistors.

BACKGROUND

Transistors play an essential role in modern day electronic devices that are a part of daily life. There are various transistors. A thin-film transistor (TFT) is a kind of field-effect transistor including a channel layer, a gate electrode, and source and drain electrodes, over a supporting but non-conducting substrate. On the other hand, a conventional transistor has a channel typically within a substrate, such as a silicon substrate. TFTs have emerged as an attractive option to fuel Moore's law by integrating TFTs vertically in the backend, while leaving the silicon substrate areas for high-speed transistors. In addition, a transistor may have various architectures. A conventional transistor includes a metal structure called a gate mounted on top of a flat channel of silicon substrate to control the flow of current through the channel from a source electrode to a drain electrode. A three dimensional transistor, e.g., a fin field effect (FinFET) transistor, may be built on a substrate with a gate normally wrapped around a fin-shaped channel area between a source area and a drain area. Transistors may be made using various technologies. For example, atomic layer deposition (ALD) is a vapor phase technique capable of producing thin films of a variety of materials. Based on sequential, self-limiting reactions, ALD can offer high quality conformity and accurate thickness control, and has emerged as a powerful tool for many applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
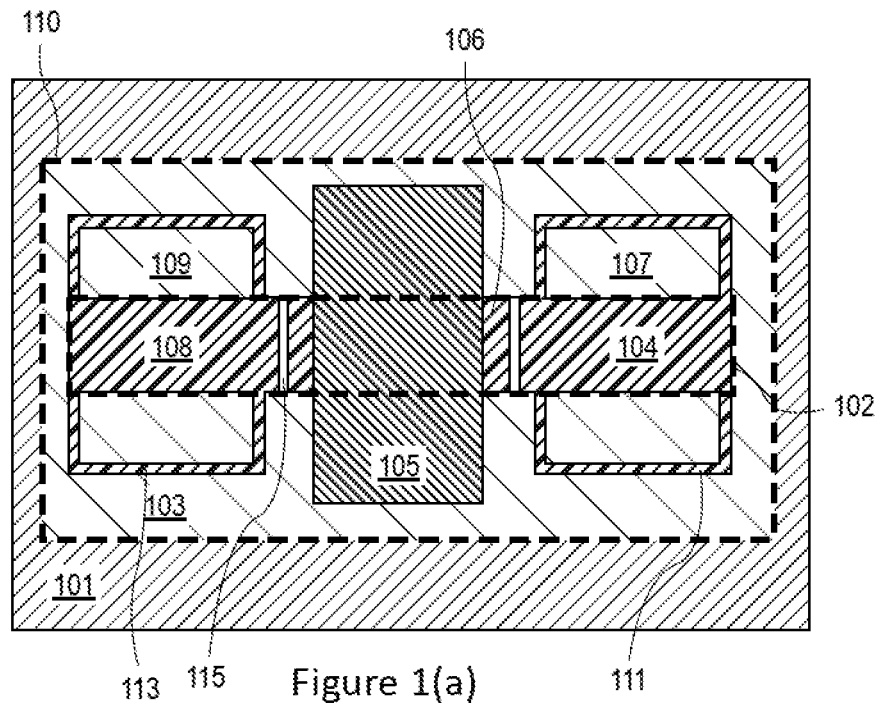
FIGS. 1(a)-1(g) schematically illustrate diagrams in top down views of three-dimensional transistors above a substrate, in accordance with some embodiments.

There are various transistors, e.g., thin-film transistor (TFT) with a channel formed over a supporting but non-conducting substrate, or a conventional transistor with a channel typically within a substrate. In addition, a conventional transistor includes a gate mounted on top of a flat channel of silicon substrate, while a three dimensional transistor, e.g., a fin field effect (FinFET) transistor, may be built on a substrate with a gate normally wrapped around a fin-shaped channel area between a source area and a drain area. Transistors may be made using various technologies, e.g., atomic layer deposition (ALD), which is a vapor phase technique capable of producing thin films of a variety of materials.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes an interconnect structure having metal contacts, dielectrics layers, e.g., inter-level dielectric (ILD) layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL.

A TFT is normally formed at BEOL. TFTs may be fabricated in various architectures, e.g., a back-gated or bottom gate architecture, or a top-gate architecture. However, it is a challenge to integrate a TFT at the FEOL to withstand high temperature steps that happen at the FEOL. Embodiments herein present techniques to enable the TFT heterogeneously integrated at the FEOL or at the BEOL to have more design flexibility.

Embodiments herein may present a TFT having some electrode, e.g., a source electrode, a drain electrode, or a gate electrode formed first before a channel layer of the TFT is formed. The process may form a three dimensional sacrificial channel layer above a substrate. Afterwards, an electrode, e.g., a gate electrode, is formed around the three dimensional sacrificial channel layer. The channel layer may be formed in a void space created by removing the three-dimensional sacrificial channel layer after the gate electrode is formed. The channel material may be deposited by ALD at the void space. As a result, the channel material forms a channel structure including a source area, a drain area, and a channel area. In addition, the channel material is also deposited around a sidewall of an opening in an ILD layer or a surface of the electrode since the electrode or the opening is formed before depositing the channel material. By forming the channel structure after some or all the electrodes are formed, the TFT channel does not need to withstand the high temperature used in forming the electrodes. Hence, the TFT so formed may be integrated into the FEOL or in any place at the BEOL.

Embodiments herein may present a semiconductor device including a substrate, and a three dimensional transistor above the substrate. The three dimensional transistor includes a channel structure, where the channel structure includes a channel material and has a source area, a drain area, and a channel area between the source area and the drain area. A source electrode is coupled to the source area, a drain electrode is coupled to the drain area, and a gate electrode is around the channel area. An electrode selected from the source electrode, the drain electrode, or the gate electrode is in contact with the channel material on a sidewall of an opening in an ILD layer or a surface of the electrode. The electrode is further in contact with the channel structure including the source area, the drain area, or the channel area.

Embodiments herein may present a method for forming a TFT. The method may include forming a three dimensional sacrificial channel layer above a substrate, where the sacrificial channel layer includes a sacrificial channel area, a sacrificial source area, and a sacrificial drain area. The method further includes forming a gate electrode around the sacrificial channel area, and forming an ILD layer covering the gate electrode, the substrate, and the sacrificial channel layer. Moreover, the method includes forming an opening for a source or a drain electrode in the ILD layer around the sacrificial source area or the sacrificial drain area, and forming a void space by removing the sacrificial channel layer from the opening of the source or the drain electrode. Afterwards, the method includes filling the void space by a channel material to form a channel structure including a source area, a drain area, and a channel area under the gate electrode. Furthermore, the channel material conformally covers sidewalls of the opening for the source or the drain electrode. Moreover, the method includes forming a source electrode at the opening for the source electrode, or a drain electrode at the opening for the drain electrode, where the source or drain electrode is in contact with the channel material on the sidewalls of the opening for the source or drain electrode.

Embodiments herein may present a computing device, which may include a circuit board, and a processor or a memory device coupled to the circuit board. The processor or the memory device includes a three-dimensional transistor. The three dimensional transistor includes a channel structure, where the channel structure includes a channel material and has a source area, a drain area, and a channel area between the source area and the drain area. A source electrode is coupled to the source area, a drain electrode is coupled to the drain area, and a gate electrode is around the channel area. An electrode selected from the source electrode, the drain electrode, or the gate electrode is in contact with the channel material on a sidewall of an opening in an ILD layer or a surface of the electrode. The electrode is further in contact with the channel structure including the source area, the drain area, or the channel area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
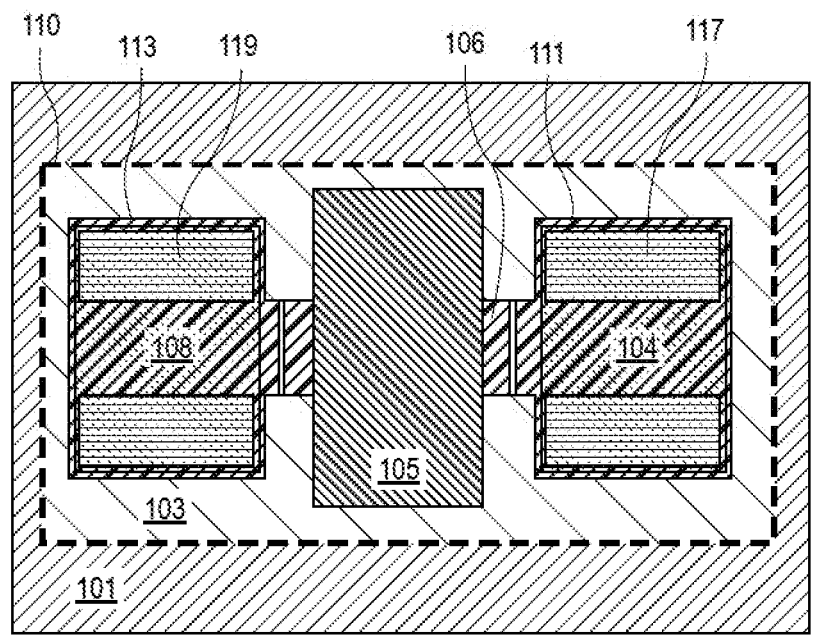
Figure 1C:
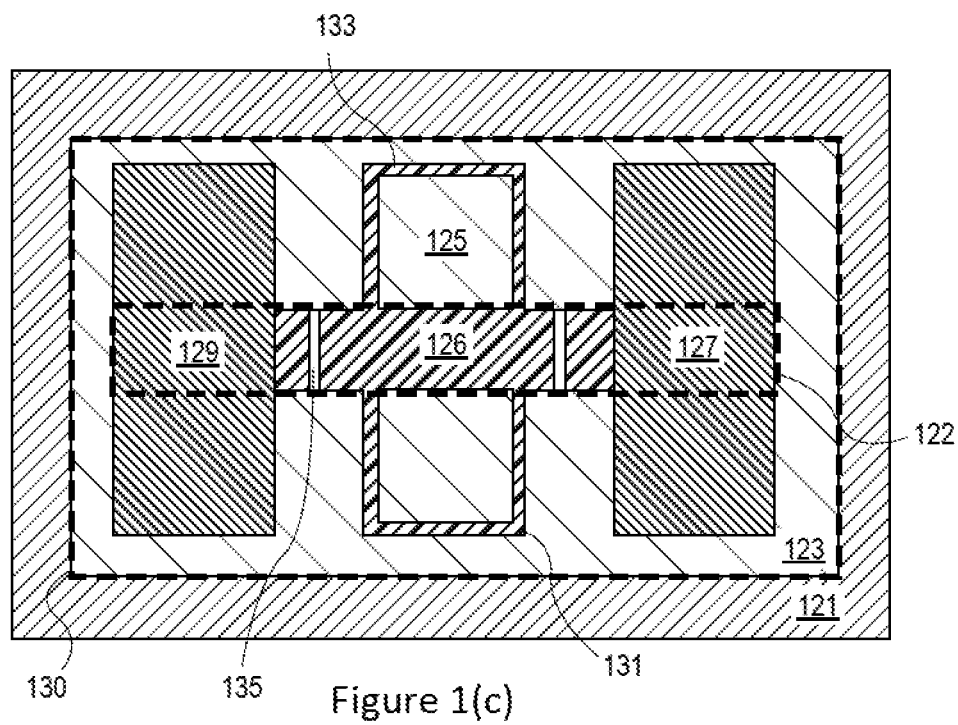
Figure 1D:
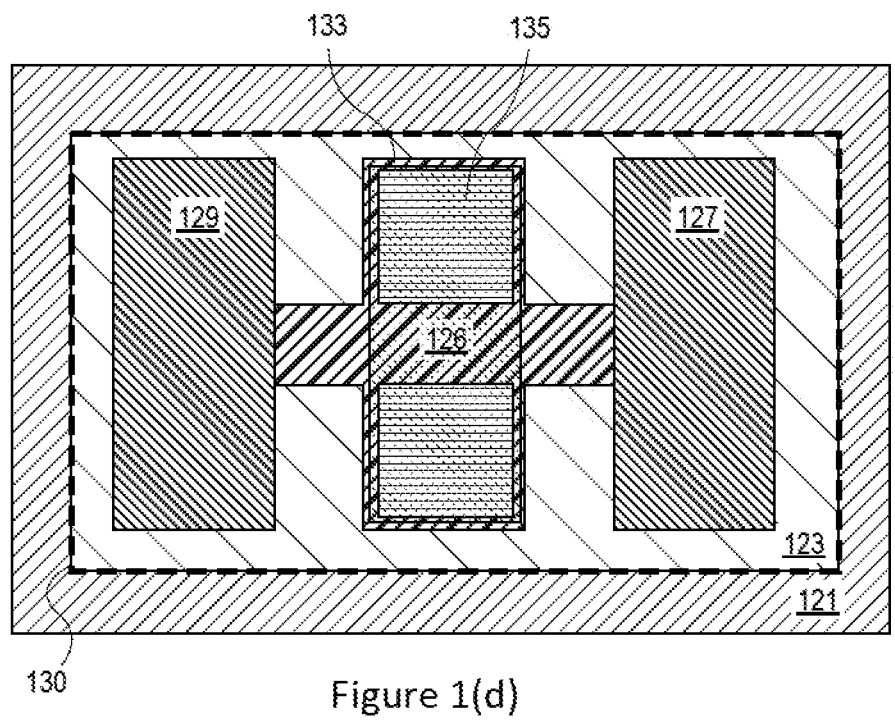
Figure 1E:
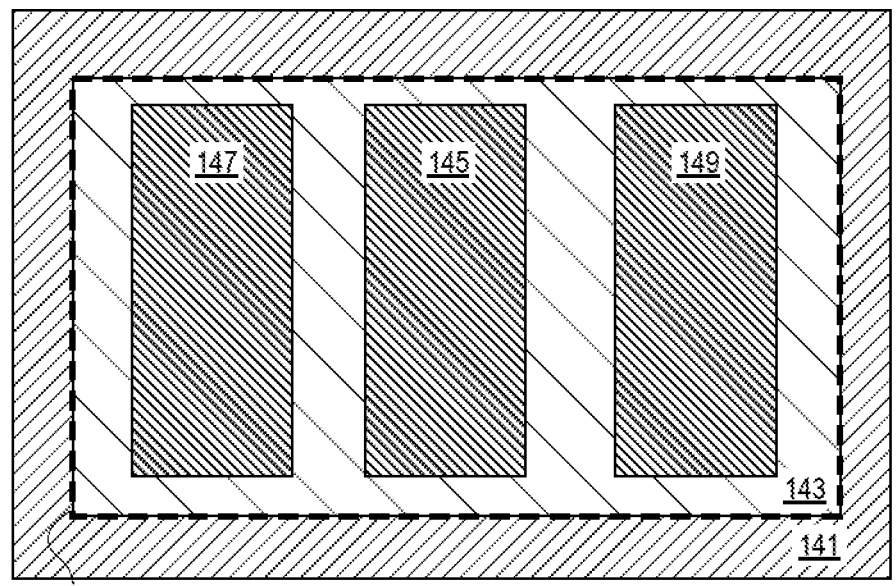
Figure 1F:
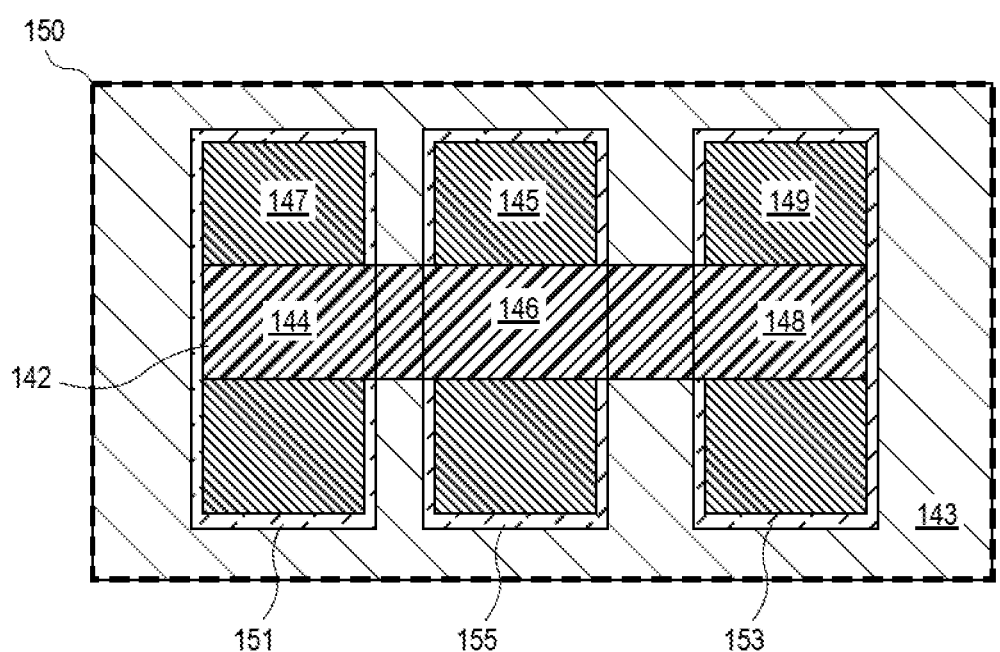
Figure 1G:
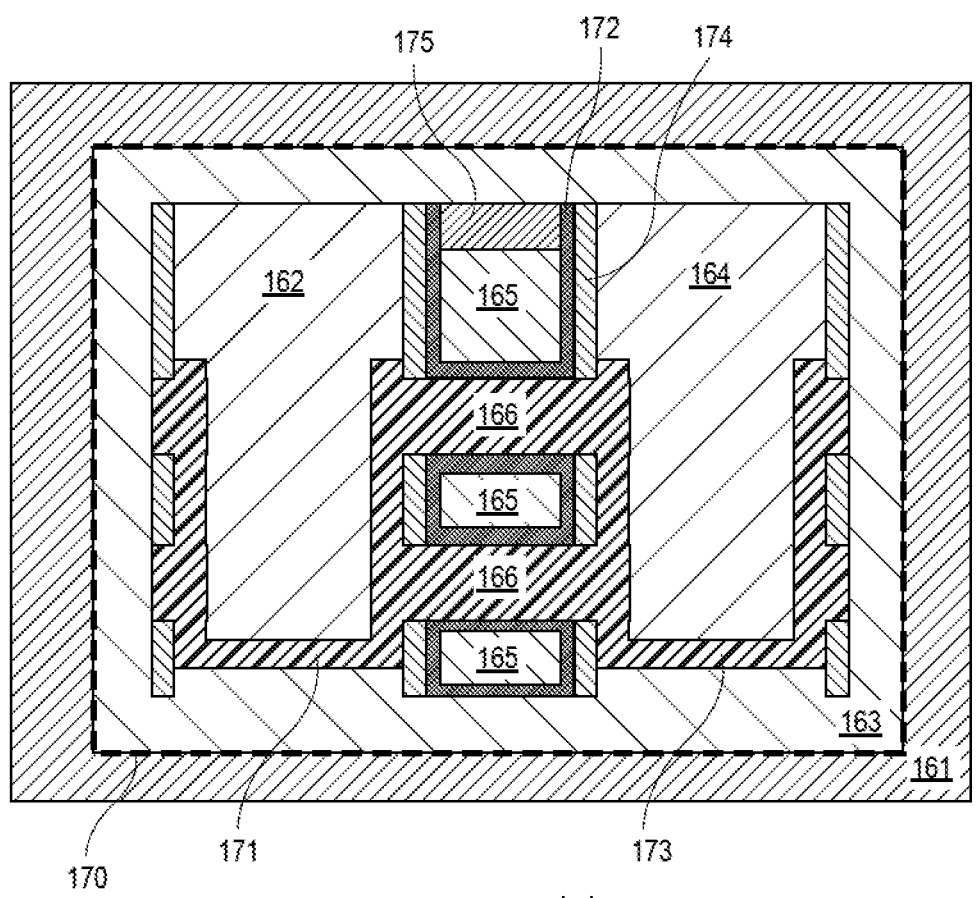

FIGS. 1(a)-1(g) schematically illustrate diagrams in top down views of three-dimensional transistors, e.g., a transistor 110, a transistor 130, a transistor 150, and a transistor 170, above a substrate, in accordance with some embodiments. In embodiments, the transistor 110, the transistor 130, the transistor 150, or the transistor 170 may be a FinFET transistor, a tri-gate FinFET transistor, a multiple-gate field-effect transistor (MuGFET), a gate-all-around FET, a nanowire transistor, or a nanoribbon transistor. For the transistor 110 shown in FIGS. 1(a)-1(b), a channel structure is formed after a gate electrode is formed but before a source or a drain electrode is formed. For the transistor 130 shown in FIGS. 1(c)-1(d), a channel structure is formed after a source and a drain electrode are formed, but before a gate electrode is formed. For the transistor 150 shown in FIGS. 1(e)-1(f), a channel structure is formed after a source electrode, a drain electrode, and a gate electrode are all formed. Furthermore, the transistor 170 shown in FIG. 1(g) illustrates a channel structure for a nanowire transistor formed after the gate electrode is formed.

In embodiments, as shown in FIG. 1(a), a semiconductor device includes a substrate 101, an ILD layer 103 above the substrate 101, and a three-dimensional transistor 110 above the substrate 101. The ILD layer 103 may be located at the FEOL above the substrate 101, or located at the BEOL above a metal layer, which is not shown. The three dimensional transistor 110 includes a channel structure 102, where the channel structure 102 include a channel material and has a source area 104, a drain area 108, and a channel area 106 between the source area 104 and the drain area 108. A gate electrode 105 is around the channel area 106. The channel material is also formed on a sidewall 111 of an opening 107 in the ILD layer 103, and on a sidewall 113 of an opening 109 in the ILD layer 103, so that at least a portion of one or more sidewalls of the opening 107 or the opening 109 is covered by the channel material. The channel material covers at least a portion of the sidewalls of the opening 107 or the opening 109 since the channel material is deposited, e.g., by ALD, after the opening 107 or the opening 109 is formed first. Embodiments herein have the gate electrode 105 formed first, the channel structure 102 formed after the gate electrode 105. In addition, the channel structure 102 may include one or more seams 115 within the channel structure 102, which may be a by-product of using ALD technology. If some other technology is used to deposit the channel material to form the channel structure 102, there may not be any seams within the channel structure 102.

In embodiments, as shown in FIG. 1(b), a source electrode 117 and a drain electrode 119 are formed after the channel structure 102 is formed. The source electrode 117 is coupled to the source area 104 of the channel structure 102, and the drain electrode 119 is coupled to the drain area 108 of the channel structure 102. In addition, the source electrode 117 is coupled to the channel material formed on the sidewall 111 of the opening 107. At least a portion of the source electrode 117 is within the opening 107, and the source electrode 117 is in contact with the channel material covering the portion of the one or more sidewalls 111 of the opening 107. Similarly, the drain electrode 119 is coupled to the channel material formed on the sidewall 113 of the opening 109. At least a portion of the drain electrode 119 is within the opening 109, and the drain electrode 119 is in contact with the channel material covering the portion of the one or more sidewalls 113 of the opening 109.

In embodiments, an electrode, e.g., the gate electrode 105, the source electrode 117, the drain electrode 119, may include germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO. In some embodiments, the gate electrode 105, the source electrode 117, the drain electrode 119 may include multiple layers.

In embodiments, the channel material in the channel structure 102 or covering the sidewall 111 or the sidewall 113, may include a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

In embodiments, the substrate 101 may be a bulk substrate, a silicon-on-insulator (SOI) substrate, a silicon substrate, a glass substrate, a metal substrate, or a plastic substrate. The substrate 101 may have a thickness around 500 um to around 1000 um. In embodiments, the ILD layer 103 may include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

In addition, there may be other components of the transistor 110, not shown. For example, the transistor 110 further includes an epitaxial layer between the source area 104 and the source electrode 117, or between the drain area 108 and the drain electrode 119. The epitaxial layer may include a material selected from a group consisting of SiP, Si, $Si_{1-x}Ge_x$, and SiC.

In embodiments, as shown in FIG. 1(c), a semiconductor device includes a substrate 121, an ILD layer 123 above the substrate 121, and the three-dimensional transistor 130 above the substrate 121. The three dimensional transistor 130 includes a channel structure 122, where the channel structure 122 includes a channel material and has a source area, a drain area, and a channel area 126 between the source area and the drain area. A source electrode 127 is in contact with the source area, and a drain electrode 129 is in contact with the drain area, where the source area and drain area are not shown since they are below the source electrode 127 and the drain electrode 129. Embodiments herein have the source electrode 127 and the drain electrode 129 formed before the channel structure 122 is formed. In forming the channel structure 122, the channel material is also formed on a sidewall 133 and 131 of an opening 125 in the ILD layer 123, so that at least a portion of one or more sidewalls 133 and 131 of the opening 125 is covered by the channel material. The channel material covers at least a portion of the sidewalls of the opening 125 since the channel material is deposited, e.g., by ALD, after the opening 125 is formed first. In addition, the channel structure 122 may include one or more seams 135 within the channel structure 122, which may be a by-product of using ALD technology.

In embodiments, as shown in FIG. 1(d), a gate electrode 135 is formed after the channel structure 122 has been formed. The gate electrode 135 is formed around the channel area 126 of the channel structure 122. In addition, the gate electrode 135 is coupled to the channel material formed in the sidewall 133 of the opening 125. At least a portion of the gate electrode 135 is within the opening 125.

In embodiments, as shown in FIGS. 1(e)-1(f), the transistor 150 has a channel structure formed after a source electrode, a drain electrode, and a gate electrode are all formed. In embodiments, as shown in FIG. 1(e), a semiconductor device includes a substrate 141, an ILD layer 143 above the substrate 141, and the three-dimensional transistor 150 above the substrate 141. The three-dimensional transistor 150 includes a source electrode 147, a drain electrode 149, and a gate electrode 145, all formed before a channel structure is formed. The source electrode 147, the drain electrode 149, and the gate electrode 145 may be formed within the ILD layer 143.

In embodiments, as shown in FIG. 1(f), a channel structure 142 is formed after the source electrode 147, the drain electrode 149, and the gate electrode 145 have been formed. In such a situation, the substrate 141 may be removed so that the ILD layer 143 may be accessed from the back. Afterwards, a channel structure 142 is formed, where the channel structure 142 includes a source area 144, a channel area 146, and a drain area 148. The source electrode 147 is coupled to the source area 144, the drain electrode 149 is coupled to the drain area 148, and the gate electrode 145 is around the channel area 146. In forming the channel structure 142, the channel material is also formed on the surfaces of the source electrode 147, the drain electrode 149, and the gate electrode 145. The channel material may be deposited by ALD, and one or more seams, not shown, may be formed within the channel structure 142. Furthermore, the channel material covers at least a portion of the surfaces, e.g., a surface 151, a surface 153, and a surface 155, of source electrode 147, the drain electrode 149, and the gate electrode 145, respectively.

In embodiments, as shown in FIG. 1(g), the transistor 170 is a nanowire transistor having a channel structure formed after the gate electrode is formed. In embodiments, as shown in FIG. 1(g), a semiconductor device includes a substrate 161, an ILD layer 163 above the substrate 161, and the three-dimensional transistor 170 above the substrate 161. The three-dimensional transistor 170 includes a gate electrode 165, where the gate electrode 165 is around multiple nanowires 166 and separated by a gate dielectric layer 172. In addition, the channel material is deposited around a portion of a sidewall 171 of a source area, and around a portion of a sidewall 173 of a drain area. A source electrode 162 and a drain electrode 164 are formed after the nanowires 166 and the channel materials covering the portion of the sidewall 171 and the sidewall 173. Spacers 174 or a capping layer 175 may be formed to separate the source electrode 162, the drain electrode 164, and the gate electrode 165. The source electrode 162 is in contact with the channel material covering the portion of the sidewall 171. The drain electrode 164 is in contact with the channel material covering the portion of the sidewall 173.

In embodiments, the gate dielectric layer 172 may include a high-k dielectric material. For example, the gate dielectric layer 172 includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, PZT, or a high-k dielectric material selected from the group consisting of hafnium silicate, zirconium silicate, hafnium dioxide, zirconium dioxide, aluminum oxide, and nitride hafnium silicate.

Figure 2A:
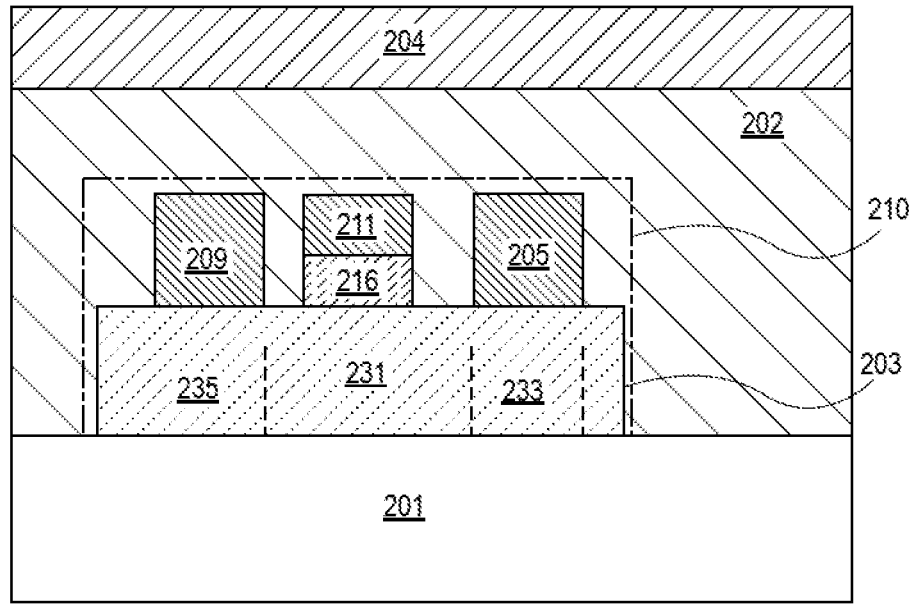
FIGS. 2(a)-2(b) schematically illustrate diagrams in cross-section views of three-dimensional transistors above a substrate, in accordance with some embodiments.
Figure 2B:
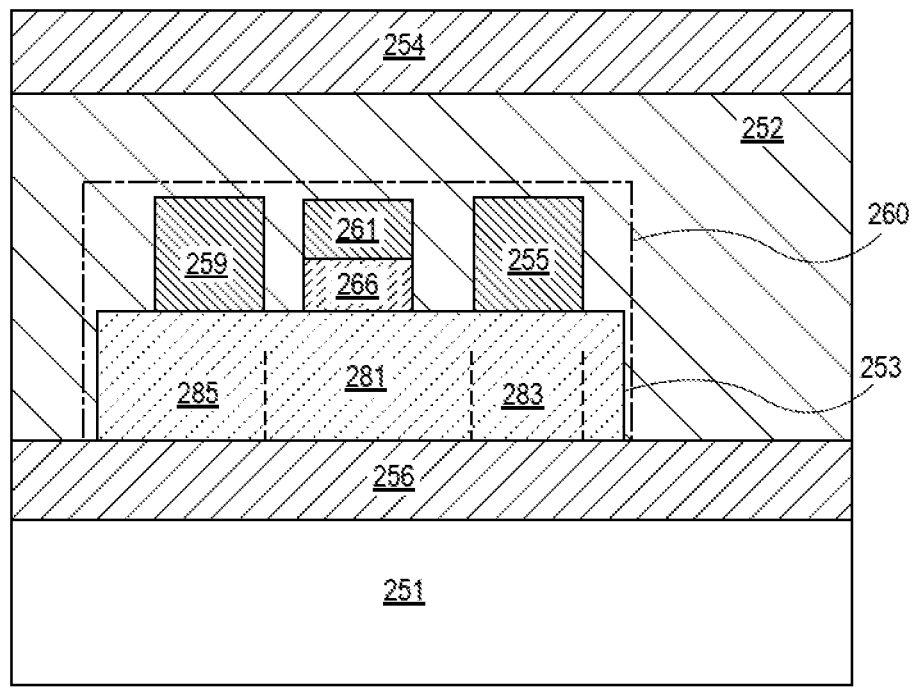

FIGS. 2(a)-2(b) schematically illustrate diagrams in cross-section views of three-dimensional transistors, e.g., a transistor 210, a transistor 260, above a substrate, in accordance with some embodiments. The transistor 210 and the transistor 260 may be similar to the transistor 110, the transistor 130, the transistor 150, or the transistor 170, as shown in FIGS. 1(a)-1(g).

In embodiments, as shown in FIG. 2(a), the transistor 210 includes a channel structure 203 formed on a substrate 201. The channel structure 203 includes a channel material and has a source area 233, a drain area 235, and a channel area 231 between the source area 233 and the drain area 235. A gate electrode 211 is around the channel area 231, and separated from the channel area 231 by a gate dielectric layer 216. A source electrode 205 is coupled to the source area 233 of the channel structure 203, and a drain electrode 209 is coupled to the drain area 235 of the channel structure 203. The channel structure 203, the gate electrode 211, the source electrode 205, and the drain electrode 209 are formed within and covered by an ILD layer 202 located at the FEOL above the substrate 201. A first metal layer 204 is above the ILD layer 202.

In embodiments, as shown in FIG. 2(b), the transistor 260 includes a channel structure 253 formed on a substrate 251. The channel structure 253 includes a channel material and has a source area 283, a drain area 285, and a channel area 281 between the source area 283 and the drain area 285. A gate electrode 261 is around the channel area 281, and separated from the channel area 281 by a gate dielectric layer 266. A source electrode 255 is coupled to the source area 283 of the channel structure 253, and a drain electrode 259 is coupled to the drain area 285 of the channel structure 253. The channel structure 253, the gate electrode 261, the source electrode 255, and the drain electrode 259 are formed within and covered by an ILD layer 252 located at the BEOL above a metal layer 256, which is further above the substrate 251. Another metal layer 254 is above the ILD layer 252.

Figure 3:
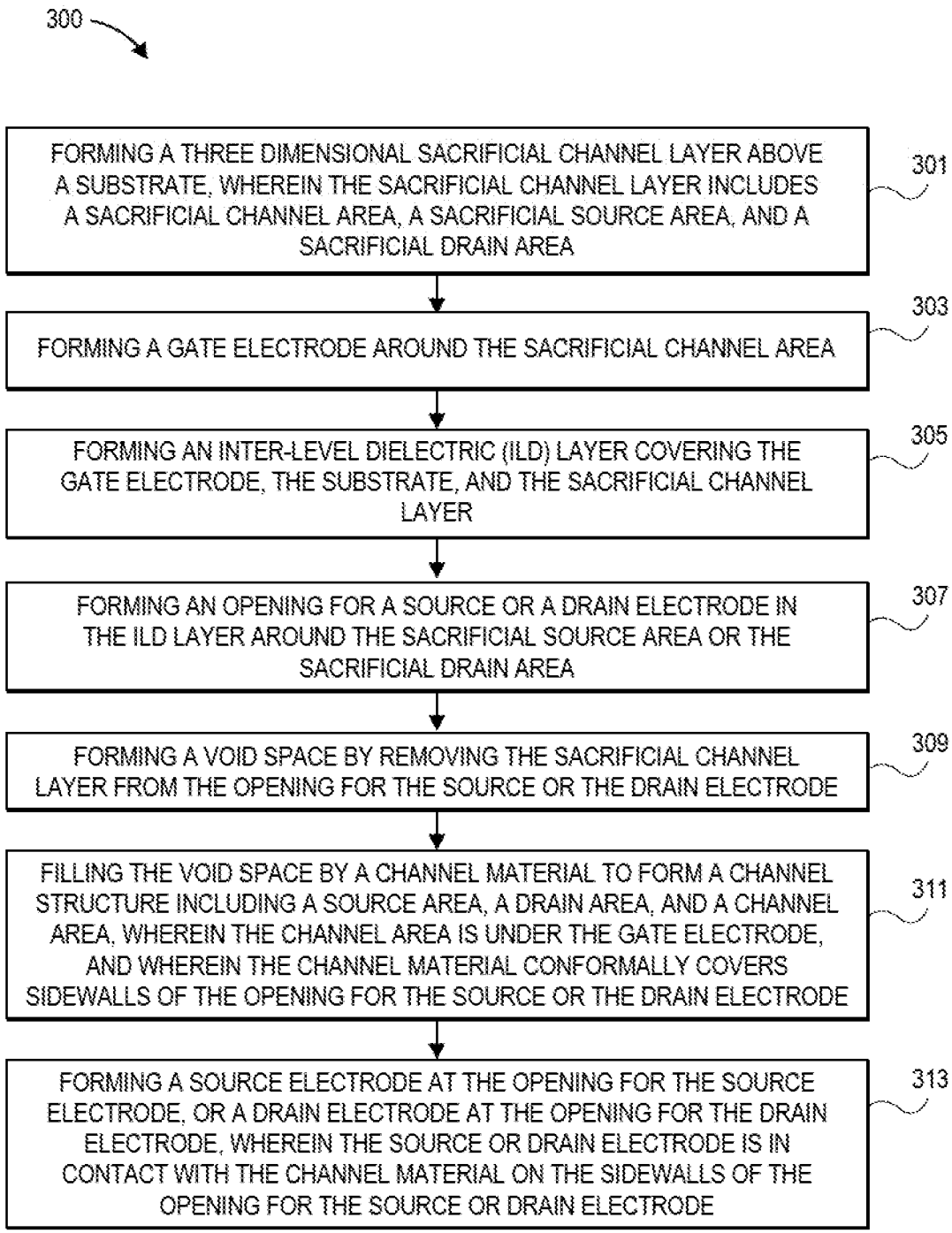
FIG. 3 schematically illustrates a process for forming a three-dimensional transistor above a substrate, in accordance with some embodiments.

FIG. 3 schematically illustrates a process 300 for forming a three-dimensional transistor above a substrate, in accordance with some embodiments. More details of the process 300 are illustrated in FIGS. 4(a)-4(d) and FIGS. 5(a)-5(e). In embodiments, the process 300 may be applied to form the transistor 110, the transistor 130, the transistor 150, or the transistor 170, as shown in FIGS. 1(a)-1(g), or the transistor 210, the transistor 260, as shown in FIGS. 2(a)-2(b).

Figure 4A:
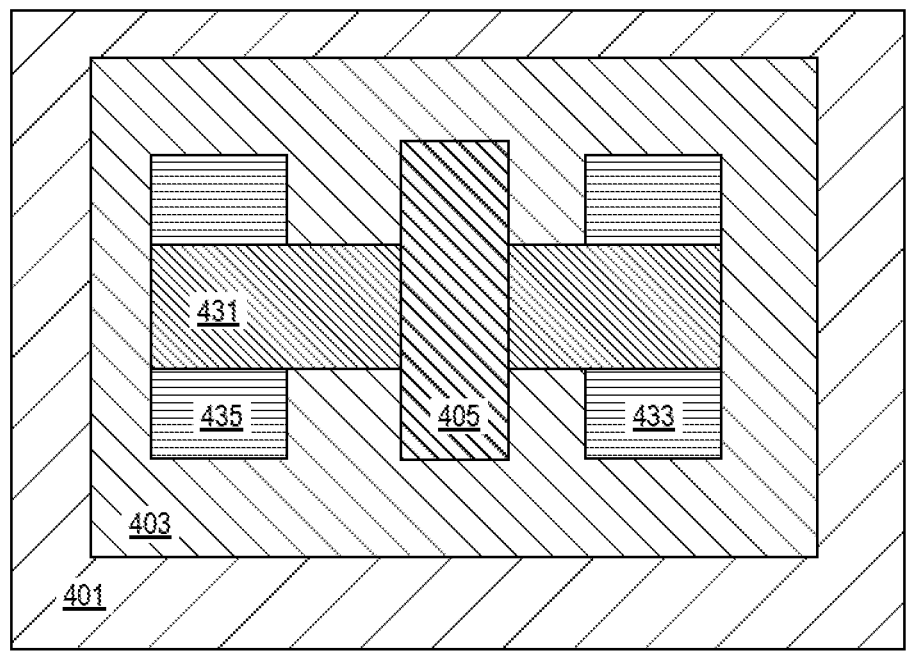
FIGS. 4(a)-4(d) illustrate a process for forming a three-dimensional transistor above a substrate, in accordance with some embodiments.
Figure 5A:
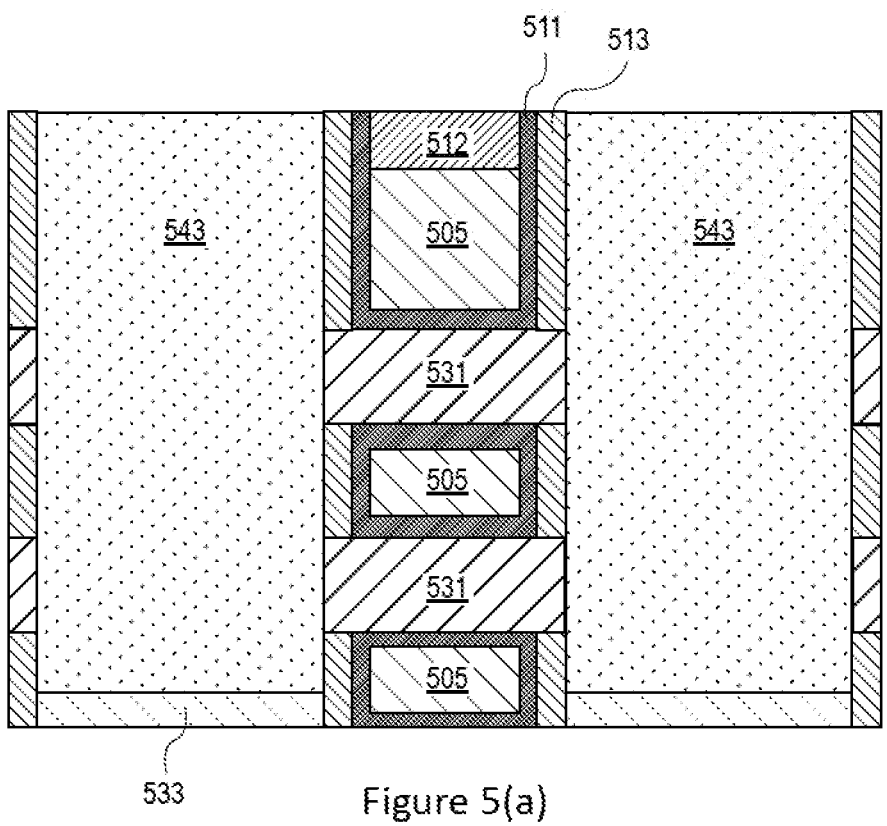
FIGS. 5(a)-5(e) illustrate a process for forming a three-dimensional transistor above a substrate, in accordance with some embodiments.

At block 301, the process 300 may include forming a three dimensional sacrificial channel layer above a substrate, wherein the sacrificial channel layer includes a sacrificial channel area, a sacrificial source area, and a sacrificial drain area. For example, as shown in FIG. 4(a), the process 300 may include forming a three dimensional sacrificial channel layer 431 above a substrate 401, wherein the sacrificial channel layer 431 includes a sacrificial channel area, a sacrificial source area, and a sacrificial drain area. In addition, as shown in FIG. 5(a), the process 300 may include forming a three dimensional sacrificial channel layer 531 above an ILD layer 533, which is above a substrate, wherein the sacrificial channel layer 531 includes a sacrificial channel area, a sacrificial source area, and a sacrificial drain area.

The sacrificial channel layer 531 may occupy areas for multiple nanowires to be formed.

At block 303, the process 300 may include forming a gate electrode around the sacrificial channel area. For example, as shown in FIG. 4(a), the process 300 may include forming a gate electrode 405 around the sacrificial channel area 431. In addition, as shown in FIG. 5(a), the process 300 may include forming a gate electrode 505 around the sacrificial channel area 531, which include areas for multiple nanowires to be formed. Furthermore, other layers, e.g., a gate dielectric layer 513, a capping layer 512, a spacer 513 may be formed around the sacrificial channel layer 531.

At block 305, the process 300 may include forming an ILD layer covering the gate electrode, the substrate, and the sacrificial channel layer. For example, as shown in FIG. 4(a), the process 300 may include forming an ILD layer 403 covering the gate electrode 405, the substrate 401, and the sacrificial channel layer 431. In addition, as shown in FIG. 5(a), the process 300 may include forming an ILD layer 543 covering the gate electrode 505, the ILD layer 533, and the sacrificial channel layer 531.

Figure 5B:
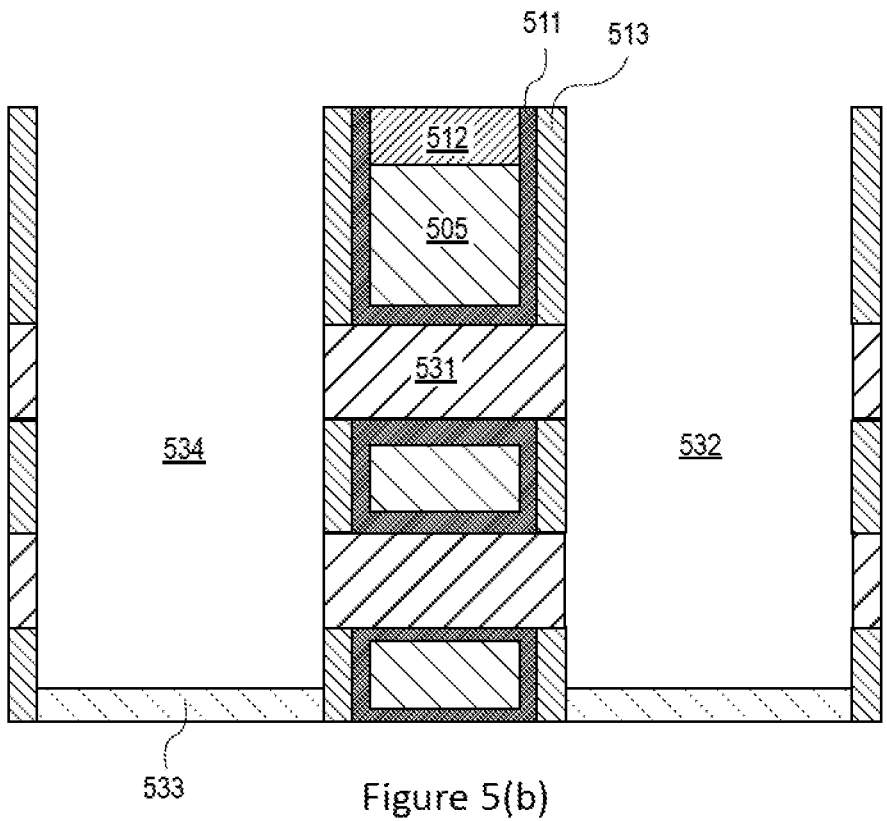

At block 307, the process 300 may include forming an opening for a source or a drain electrode in the ILD layer around the sacrificial source area or the sacrificial drain area. For example, as shown in FIG. 4(a), the process 300 may include forming an opening 433 for a source electrode, and an opening 435 for a drain electrode in the ILD layer 403 around the sacrificial source area or the sacrificial drain area. In addition, as shown in FIG. 5(b), the process 300 may include forming an opening 532 for a source electrode, and an opening 534 for a drain electrode in the ILD layer 543 around the sacrificial source area or the sacrificial drain area.

Figure 4B:
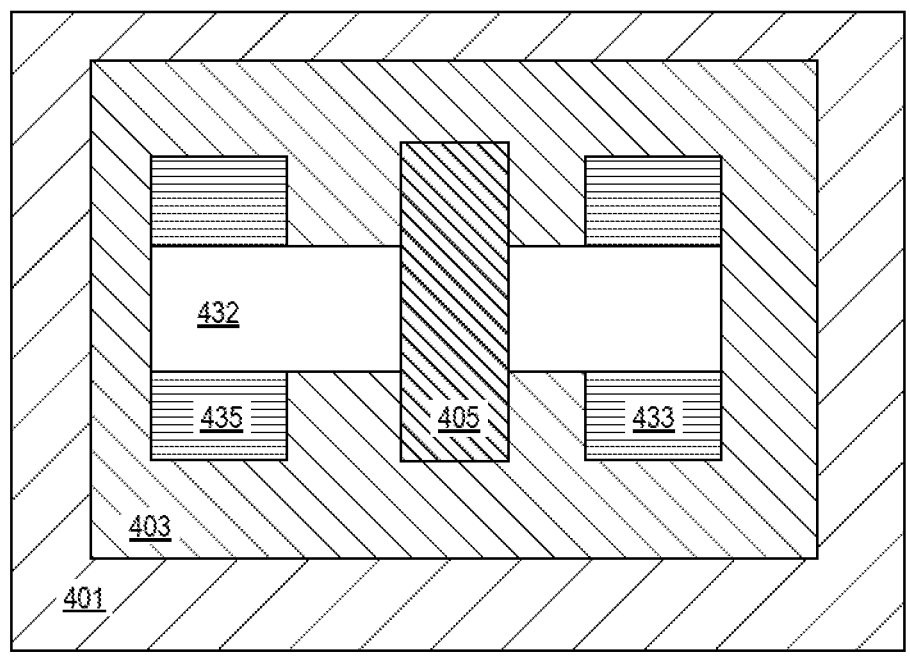
Figure 5C:
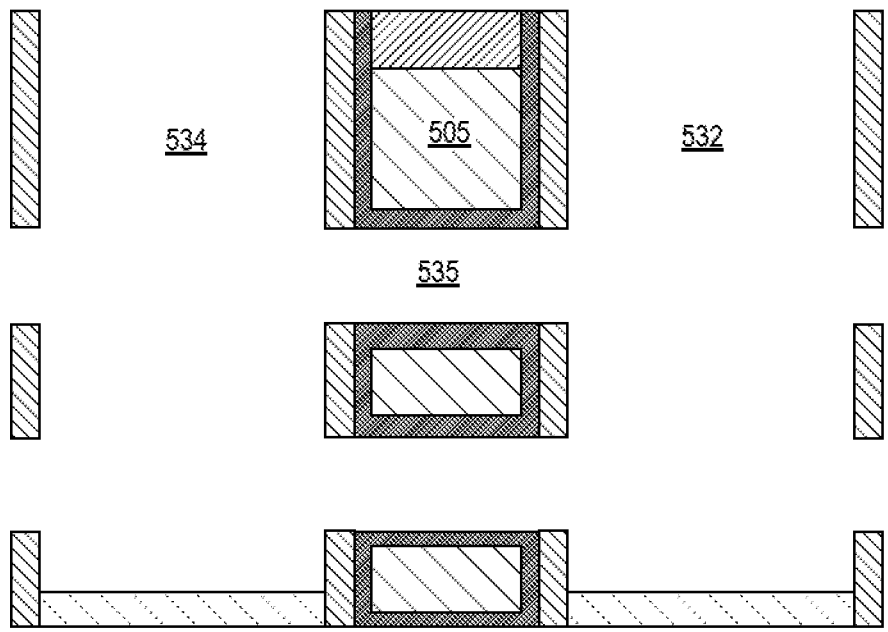

At block 309, the process 300 may include forming a void space by removing the sacrificial channel layer from the opening for the source or the drain electrode. For example, as shown in FIG. 4(b), the process 300 may include forming a void space 432 by removing the sacrificial channel layer from the opening 433 for the source electrode, or from the opening 435 for the drain electrode. In addition, as shown in FIG. 5(c), the process 300 may include forming a void space 535 by removing the sacrificial channel layer from the opening 532 for the source electrode, or from the opening 534 for the drain electrode.

Figure 4C:
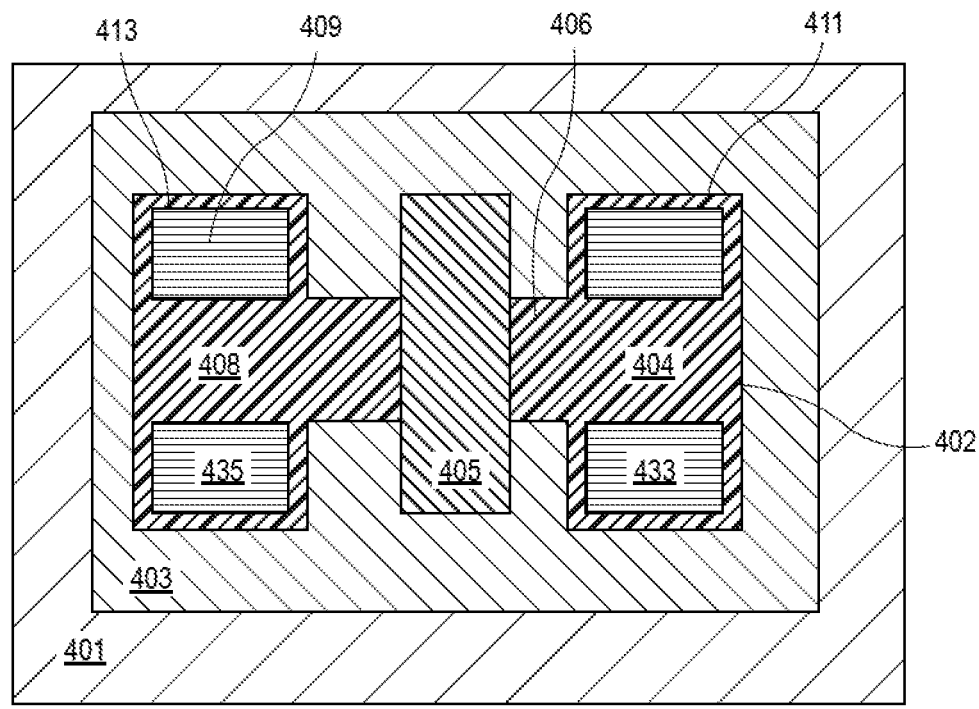
Figure 5D:
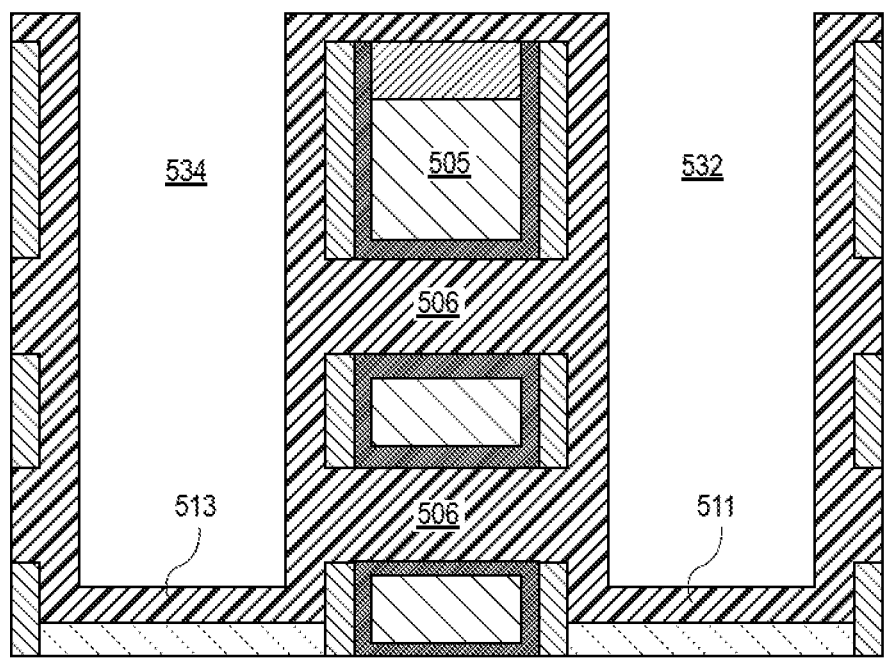

At block 311, the process 300 may include filling the void space by a channel material to form a channel structure including a source area, a drain area, and a channel area, where the channel area is under the gate electrode, and the channel material conformally covers sidewalls of the opening for the source or the drain electrode. For example, as shown in FIG. 4(c), the process 300 may include filling the void space 432 by a channel material to form a channel structure 402 including a source area 404, a drain area 408, and a channel area 406, where the channel area 406 is under the gate electrode 405, and the channel material conformally covers a sidewall 411 of the opening 433 for the source electrode, or a sidewall 413 of the opening 435 for the drain electrode. In addition, as shown in FIG. 5(d), the process 300 may include filling the void space 535 by a channel material to form a channel structure including a source area, a drain area, and a channel area 506, where the gate electrode 505 is around the channel area 506, and the channel material conformally covers a sidewall 511 of the opening 532 for the source electrode, or a sidewall 513 of the opening 534 for the drain electrode.

Figure 4D:
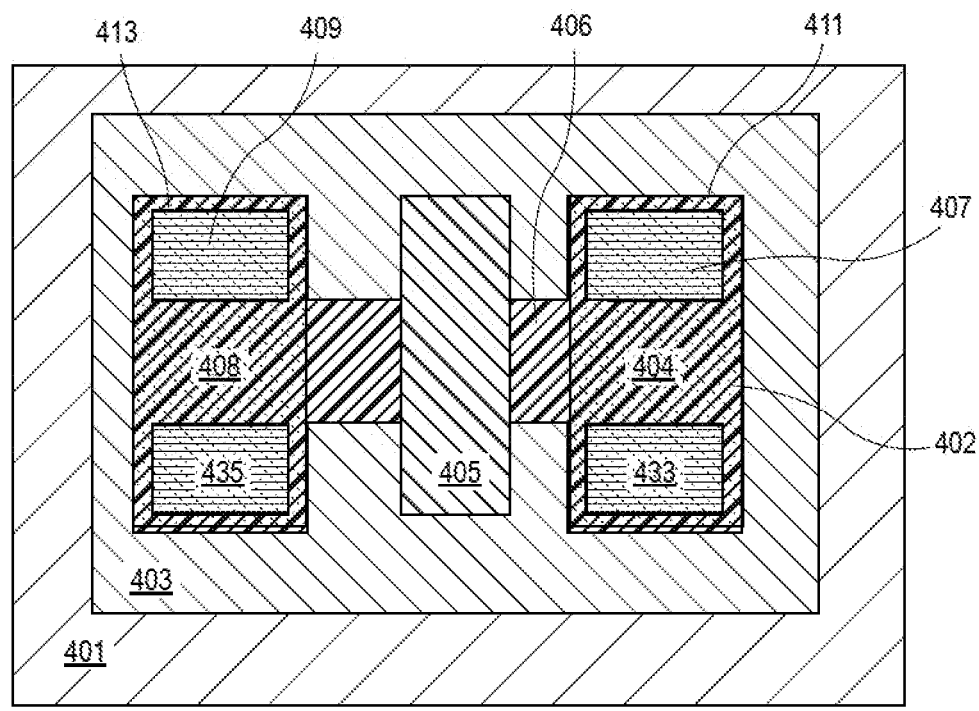
Figure 5E:
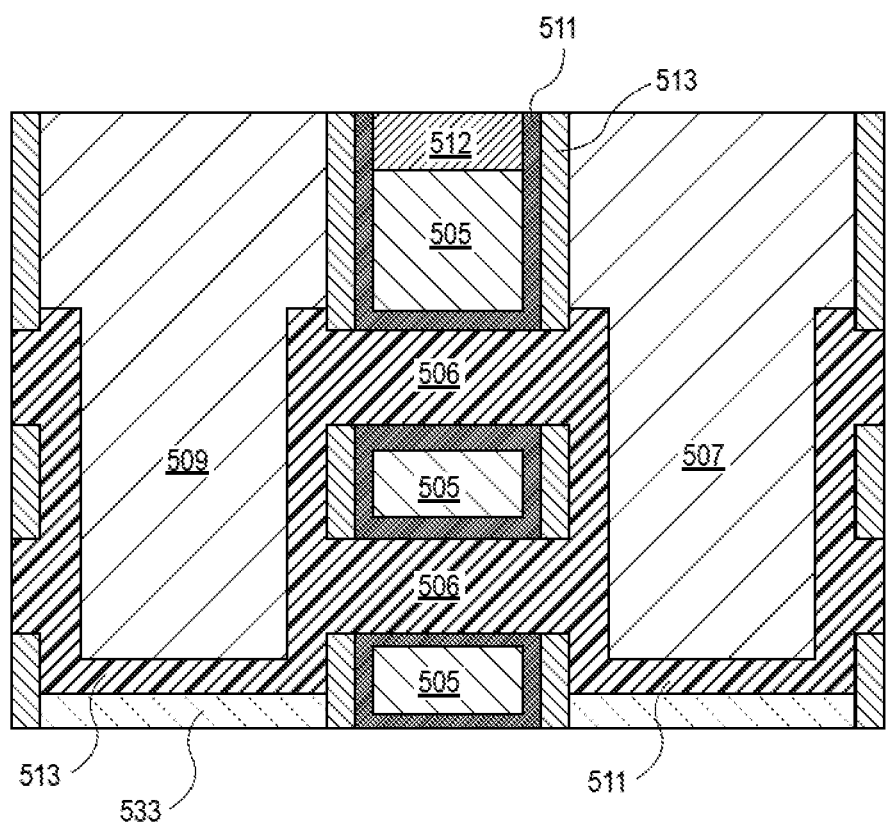

At block 313, the process 200 may include forming a source electrode at the opening for the source electrode, or a drain electrode at the opening for the drain electrode, where the source or drain electrode is in contact with the channel material on the sidewalls of the opening for the source or drain electrode. For example, as shown in FIG. 4(d), the process 300 may include forming a source electrode 407 at the opening 433 for the source electrode, and a drain electrode 409 at the opening 435 for the drain electrode, where the source electrode 407 is in contact with the channel material on the sidewall 411 of the opening 433 for the source electrode, and the drain electrode 409 is in contact with the channel material on the sidewall 413 of the opening 435 for the drain electrode. In addition, as shown in FIG. 5(e), the process 300 may include forming a source electrode 507 at the opening 532 for the source electrode, and a drain electrode 509 at the opening 534 for the drain electrode, where the source electrode 507 is in contact with the channel material on the sidewall 511 of the opening 532 for the source electrode, and the drain electrode 509 is in contact with the channel material on the sidewall 513 of the opening 534 for the drain electrode.

In addition, the process 300 may include additional operations to form other layers, e.g., ILD layers, a spacer, encapsulation layers, insulation layers, not shown.

Figure 6:
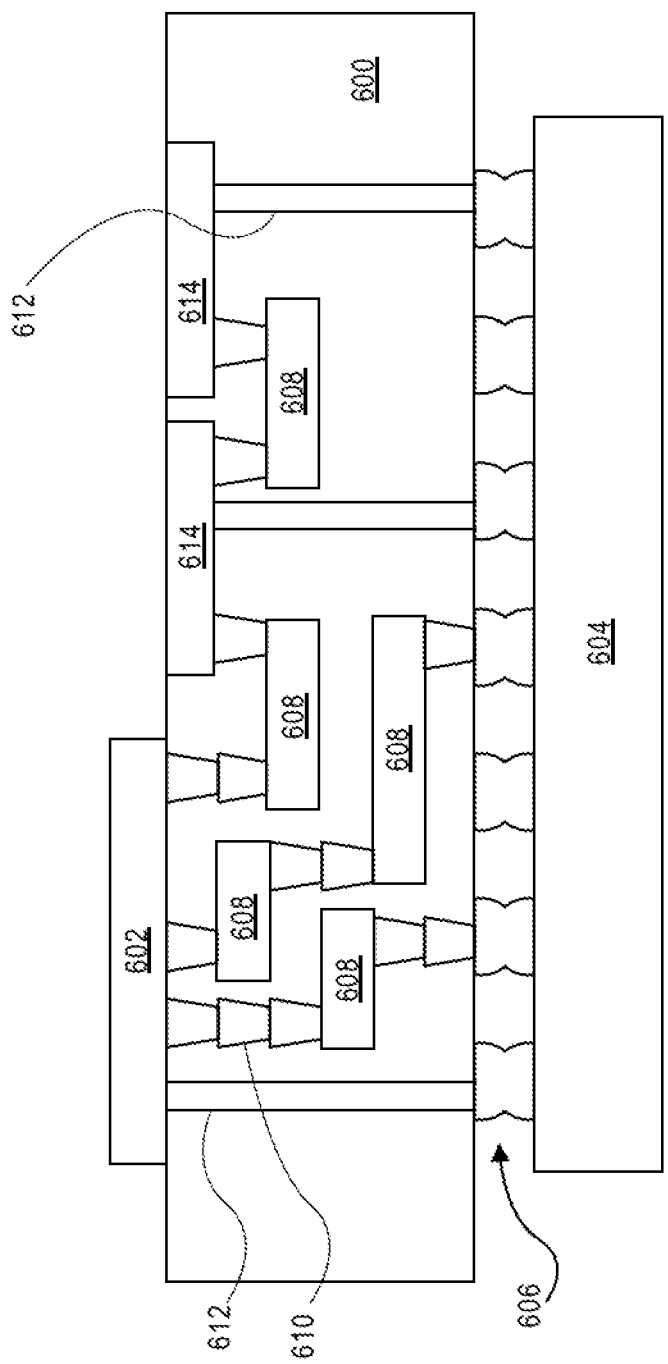
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a transistor, e.g., the transistor 110, the transistor 130, the transistor 150, or the transistor 170, as shown in FIGS. 1(a)-1(g), or the transistor 210, the transistor 260, as shown in FIGS. 2(a)-2(b). The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
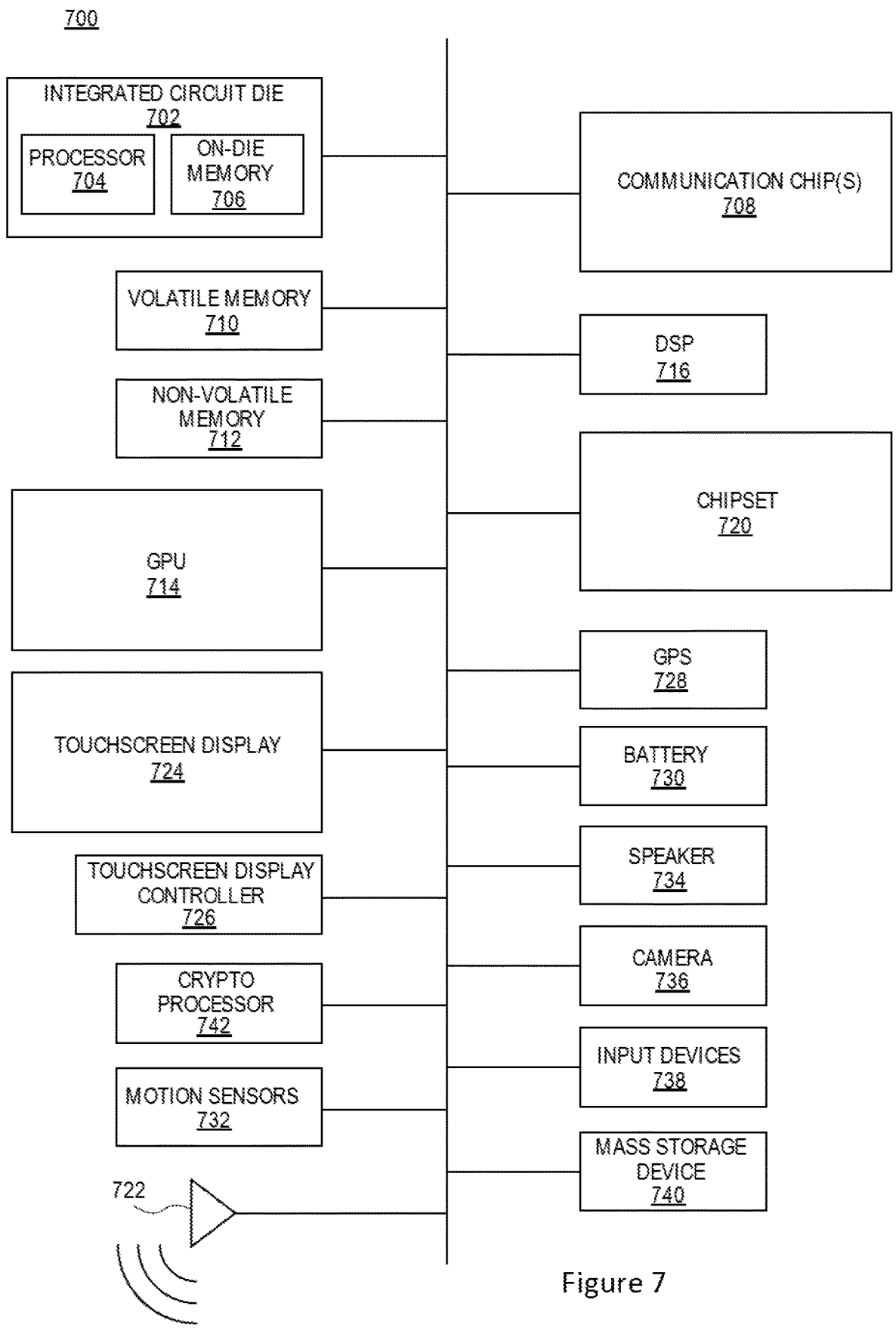
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the transistor 110, the transistor 130, the transistor 150, or the transistor 170, as shown in FIGS. 1(*a*)-1(*g*), or the transistor 210, the transistor 260, as shown in FIGS. 2(*a*)-2(*b*).

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others. For example, the touchscreen display 724 may include the transistor 110, the transistor 130, the transistor 150, or the transistor 170, as shown in FIGS. 1(*a*)-1(*g*), or the transistor 210, the transistor 260, as shown in FIGS. 2(*a*)-2(*b*), or a transistor formed according to the process 300 shown in FIG. 3.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the transistor 110, the transistor 130, the transistor 150, or the transistor 170, as shown in FIGS. 1(*a*)-1(*g*), or the transistor 210, the transistor 260, as shown in FIGS. 2(*a*)-2(*b*), or a transistor formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some Non-Limiting Examples are Provided Below

Example 1 may include a semiconductor device, comprising: a substrate; a three dimensional transistor above the substrate, including: a channel structure, wherein the channel structure includes a channel material and has a source area, a drain area, and a channel area between the source area and the drain area; and a source electrode coupled to the source area, a drain electrode coupled to the drain area, and a gate electrode around the channel area, wherein an electrode selected from the source electrode, the drain electrode, or the gate electrode is in contact with the channel material on a sidewall of an opening in an inter-level dielectric (ILD) layer or a surface of the electrode, and the electrode is further in contact with the channel structure including the source area, the drain area, or the channel area.

Example 2 may include the semiconductor device of example 1 and/or some other examples herein, wherein the channel structure further includes one or more seams within the channel structure.

Example 3 may include the semiconductor device of examples 1-2 and/or some other examples herein, wherein at least a portion of the electrode is within the opening in the ILD layer, at least a portion of one or more sidewalls of the opening is covered by the channel material, and the electrode is contact with the channel material covering the portion of the one or more sidewalls of the opening.

Example 4 may include the semiconductor device of examples 1-2 and/or some other examples herein, wherein the opening in the ILD layer is located at the front end of the line.

Example 5 may include the semiconductor device of examples 1-2 and/or some other examples herein, wherein the opening in the ILD layer is at the back end of the line.

Example 6 may include the semiconductor device of examples 1-2 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 7 may include the semiconductor device of examples 1-2 and/or some other examples herein, wherein the three-dimensional transistor is a FinFET transistor, a tri-gate FinFET transistor, a multiple-gate field-effect transistor (MuGFET), a gate-all-around FET, a nanowire transistor, or a nanoribbon transistor.

Example 8 may include the semiconductor device examples 1-2 and/or some other examples herein, wherein the three-dimensional transistor is a nanowire transistor, wherein the channel structure includes multiple nanowires having the channel material, the three-dimensional transistor further includes a spacer between the source electrode and the gate electrode, and at least a portion of one or more sidewalls of the spacer is covered by the channel material, and the source electrode is contact with the channel material covering the portion of the one or more sidewalls of the spacer.

Example 9 may include the semiconductor device of examples 1-2 and/or some other examples herein, wherein the channel material includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 10 may include the semiconductor device of examples 1-2 and/or some other examples herein, wherein the substrate is a bulk substrate, a silicon-on-insulator (SOI) substrate, a silicon substrate, a glass substrate, a metal substrate, or a plastic substrate.

Example 11 may include the semiconductor device of examples 1-2 and/or some other examples herein, wherein the gate electrode, the source electrode, or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

Example 12 may include the semiconductor device of examples 1-2 and/or some other examples herein, wherein the three-dimensional transistor further includes a gate dielectric layer separating the gate electrode and the channel structure.

Example 13 may include the semiconductor device of example 12 and/or some other examples herein, wherein the gate dielectric layer includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, PZT, or a high-k dielectric material selected from the group consisting of hafnium silicate, zirconium silicate, hafnium dioxide, zirconium dioxide, aluminum oxide, and nitride hafnium silicate.

Example 14 may include the semiconductor device of examples 1-2 and/or some other examples herein, wherein the three-dimensional transistor further includes an epitaxial layer between the source area and the source electrode, or between the drain area and the drain electrode.

Example 15 may include the semiconductor device of example 14 and/or some other examples herein, wherein the epitaxial layer includes a material selected from a group consisting of SiP, Si, $Si_{1-x}Ge_x$, and SiC.

Example 16 may include a method for forming a three-dimensional transistor, the method comprising: forming a three dimensional sacrificial channel layer above a substrate, wherein the sacrificial channel layer includes a sacrificial channel area, a sacrificial source area, and a sacrificial drain area; forming a gate electrode around the sacrificial channel area; forming an inter-level dielectric (ILD) layer covering the gate electrode, the substrate, and the sacrificial channel layer; forming an opening for a source or a drain electrode in the ILD layer around the sacrificial source area or the sacrificial drain area; forming a void space by removing the sacrificial channel layer from the opening for the source or the drain electrode; filling the void space by a channel material to form a channel structure including a source area, a drain area, and a channel area, wherein the channel area is under the gate electrode, and wherein the channel material conformally covers sidewalls of the opening for the source or the drain electrode; and forming a source electrode at the opening for the source electrode, or a drain electrode at the opening for the drain electrode, wherein the source or drain electrode is in contact with the channel material on the sidewalls of the opening for the source or drain electrode.

Example 17 may include the method of example 16 and/or some other examples herein, wherein the filling the void space by the channel material includes filling the void space by the channel material by atomic layer deposition (ALD).

Example 18 may include the method of example 17 and/or some other examples herein, wherein the channel area further includes one or more seams within the channel area.

Example 19 may include the method of examples 16-18 and/or some other examples herein, wherein the opening in the ILD layer is located at the front end of the line.

Example 20 may include the method of examples 16-18 and/or some other examples herein, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 21 may include a computing device, comprising: a circuit board; and a processor or a memory device coupled to the circuit board, wherein the processor or the memory device includes a three-dimensional transistor, and wherein the three-dimensional transistor includes: a channel structure, wherein the channel structure includes a channel material and has a source area, a drain area, and a channel area between the source area and the drain area; and a source electrode coupled to the source area, a drain electrode coupled to the drain area, and a gate electrode around the channel area, wherein an electrode selected from the source electrode, the drain electrode, or the gate electrode is in contact with the channel material on a sidewall of an opening in an inter-level dielectric (ILD) layer or a surface of the electrode, and the electrode is further in contact with the channel structure including the source area, the drain area, or the channel area.

Example 22 may include the computing device of example 21 and/or some other examples herein, wherein the channel structure further includes one or more seams within the channel structure.

Example 23 may include the computing device of examples 21-22 and/or some other examples herein, wherein the three-dimensional transistor is a FinFET transistor, a tri-gate FinFET transistor, a multiple-gate field-effect transistor (MuGFET), a gate-all-around FET, a nanowire transistor, or a nanoribbon transistor.

Example 24 may include the computing device of examples 21-22 and/or some other examples herein, wherein the channel material includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 25 may include the computing device of examples 21-22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a three dimensional transistor above the substrate, including:
      a channel structure, wherein the channel structure includes a channel material and has a source area, a drain area, and a channel area between the source area and the drain area; and
      a source electrode coupled to the source area, a drain electrode coupled to the drain area, and a gate electrode around the channel area, wherein an electrode selected from the source electrode, the drain electrode, or the gate electrode is in contact with the channel material on a sidewall of an opening in an inter-level dielectric (ILD) layer.

2. The semiconductor device of claim 1, wherein the channel structure further includes one or more seams within the channel structure.

3. The semiconductor device of claim 1, wherein at least a portion of the electrode is within the opening in the ILD layer, at least a portion of one or more sidewalls of the opening is covered by the channel material, and the electrode is contact with the channel material covering the portion of the one or more sidewalls of the opening.

4. The semiconductor device of claim 1, wherein the opening in the ILD layer is located at the front end of the line.

5. The semiconductor device of claim 1, wherein the opening in the ILD layer is at the back end of the line.

6. The semiconductor device of claim 1, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

7. The semiconductor device of claim 1, wherein the three-dimensional transistor is a FinFET transistor, a tri-gate FinFET transistor, a multiple-gate field-effect transistor (MuGFET), a gate-all-around FET, a nanowire transistor, or a nanoribbon transistor.

8. The semiconductor device of claim 1, wherein the three-dimensional transistor is a nanowire transistor, wherein the channel structure includes multiple nanowires having the channel material, the three-dimensional transistor further includes a spacer between the source electrode and the gate electrode, and at least a portion of one or more sidewalls of the spacer is covered by the channel material, and the source electrode is contact with the channel material covering the portion of the one or more sidewalls of the spacer.

9. The semiconductor device of claim 1, wherein the channel material includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

10. The semiconductor device of claim 1, wherein the substrate is a bulk substrate, a silicon-on-insulator (SOI) substrate, a silicon substrate, a glass substrate, a metal substrate, or a plastic substrate.

11. The integrated circuit of claim 1, wherein the gate electrode, the source electrode, or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

12. The semiconductor device of claim 1, wherein the three-dimensional transistor further includes a gate dielectric layer separating the gate electrode and the channel structure.

13. The semiconductor device of claim 12, wherein the gate dielectric layer includes a $HfO_2$, $ZrO_2$, $TiO_2$, $Ta_2O_5$, $Nb_2O_5$, a rare earth oxide, MgO, ferroelectric oxide, barium titanate, perovskite ferroelectrics, lead zirconate, PZT, or a high-k dielectric material selected from the group consisting of hafnium silicate, zirconium silicate, hafnium dioxide, zirconium dioxide, aluminum oxide, and nitride hafnium silicate.

14. The semiconductor device of claim 1, wherein the three-dimensional transistor further includes an epitaxial layer between the source area and the source electrode, or between the drain area and the drain electrode.

15. The semiconductor device of claim 14, wherein the epitaxial layer includes a material selected from a group consisting of SiP, Si, $Si_{1-x}Ge_x$, and SiC.

16. A computing device, comprising:
a circuit board; and
a processor or a memory device coupled to the circuit board, wherein the processor or the memory device includes a three-dimensional transistor, and wherein the three-dimensional transistor includes:
a channel structure, wherein the channel structure includes a channel material and has a source area, a drain area, and a channel area between the source area and the drain area; and
a source electrode coupled to the source area, a drain electrode coupled to the drain area, and a gate electrode around the channel area, wherein an electrode selected from the source electrode, the drain electrode, or the gate electrode is in contact with the channel material on a sidewall of an opening in an inter-level dielectric (ILD) layer.

17. The computing device of claim 16, wherein the channel structure further includes one or more seams within the channel structure.

18. The computing device of claim 16, wherein the three-dimensional transistor is a FinFET transistor, a tri-gate FinFET transistor, a multiple-gate field-effect transistor (MuGFET), a gate-all-around FET, a nanowire transistor, or a nanoribbon transistor.

19. The computing device of claim 16, wherein the channel material includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

20. The computing device of claim 16, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *